(12) United States Patent
Tokinoya et al.

(10) Patent No.: US 10,718,821 B2
(45) Date of Patent: Jul. 21, 2020

(54) POWER SUPPLY DEVICE AND ABNORMALITY DETERMINATION METHOD FOR A/D CONVERTER

(71) Applicant: Yazaki Corporation, Tokyo (JP)

(72) Inventors: Hiroshi Tokinoya, Shizuoka (JP);
Takashi Kikuchi, Shizuoka (JP);
Takahiro Miyakawa, Shizuoka (JP);
Syunsuke Nagakura, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 209 days.

(21) Appl. No.: 15/880,736

(22) Filed: Jan. 26, 2018

(65) Prior Publication Data

US 2018/0231617 A1 Aug. 16, 2018

(30) Foreign Application Priority Data

Feb. 13, 2017 (JP) ................ 2017-023822

(51) Int. Cl.
*G01R 31/40* (2020.01)
*H03M 1/46* (2006.01)
(52) U.S. Cl.
CPC .............. *G01R 31/40* (2013.01); *H03M 1/46* (2013.01)
(58) Field of Classification Search
CPC ....................................................... G01R 31/40
See application file for complete search history.

(56) References Cited

U.S. PATENT DOCUMENTS

| 8,717,037 B2 | 5/2014 | Maruyama et al. |
| 2010/0235699 A1* | 9/2010 | Terae ................ G05B 19/0425 714/735 |
| 2012/0101655 A1 | 4/2012 | Maruyama et al. |

(Continued)

FOREIGN PATENT DOCUMENTS

| JP | 05-114860 A | 5/1993 |
| JP | 8-56160 A | 2/1996 |

(Continued)

OTHER PUBLICATIONS

Communication dated Apr. 9, 2019, from the Japanese Patent Office in counterpart application No. 2017-023822.

(Continued)

*Primary Examiner* — Tung X Nguyen
*Assistant Examiner* — Feba Pothen
(74) *Attorney, Agent, or Firm* — Sughrue Mion, PLLC

(57) ABSTRACT

A power supply device includes a voltage adjusting unit, an A/D converter, a determination unit, and a supply unit configured to supply a voltage. The A/D converter includes an A/D conversion circuit, and a selector that connects any one of a plurality of input ports to the A/D conversion circuit. The input ports include load ports, a first diagnostic port, and a second diagnostic port, the supply unit supplies a first voltage value to the first diagnostic port and supplies a second voltage value to the second diagnostic port, and the determination unit determines abnormality of the A/D converter on the basis of conversion results by the A/D conversion circuit when the first diagnostic port and the A/D conversion circuit are connected together and conversion results by the A/D conversion circuit when the second diagnostic port and the A/D conversion circuit are connected together.

5 Claims, 4 Drawing Sheets

(56) References Cited

U.S. PATENT DOCUMENTS

2017/0019120 A1* 1/2017 Mallett ............... H03M 1/1076
2017/0047936 A1* 2/2017 Duryea .............. H03K 19/0005

FOREIGN PATENT DOCUMENTS

| | | |
|---|---|---|
| JP | 8-330959 A | 12/1996 |
| JP | 2003-37501 A | 2/2003 |
| JP | 2005-323273 A | 11/2005 |
| JP | 2010-263420 A | 11/2010 |
| JP | 2012-95042 A | 5/2012 |
| JP | 2013-120971 A | 6/2013 |
| JP | 2013-258628 A | 12/2013 |

OTHER PUBLICATIONS

Communication dated Jan. 29, 2019, from the Japanese Patent Office in counterpart application No. 2017-023822.

* cited by examiner

| | OUTPUT FROM SUPPLY UNIT | CONVERSION RESULT | DETERMINATION |
|---|---|---|---|
| FIRST DIAGNOSTIC PORT | HI | Vcc1 | NORMAL |
| | HI | OTHER THAN Vcc1 | ABNORMAL |
| | LO | LO | NORMAL |
| | LO | OTHER THAN LO | ABNORMAL |

| | OUTPUT FROM SUPPLY UNIT | CONVERSION RESULT | DETERMINATION |
|---|---|---|---|
| SECOND DIAGNOSTIC PORT | HI | Vcc2 | NORMAL |
| | HI | OTHER THAN Vcc2 | ABNORMAL |
| | LO | LO | NORMAL |
| | LO | OTHER THAN LO | ABNORMAL |

POWER SUPPLY DEVICE AND ABNORMALITY DETERMINATION METHOD FOR A/D CONVERTER

CROSS-REFERENCE TO RELATED APPLICATION(S)

The present application claims priority to and incorporates by reference the entire contents of Japanese Patent Application No. 2017-023822 filed in Japan on Feb. 13, 2017.

BACKGROUND OF THE INVENTION

1. Field of the Invention

The present invention relates to a power supply device and an abnormality determination method for an analog-to-digital (A/D) converter.

2. Description of the Related Art

Conventionally, there is a technique of determining abnormality of an A/D converter. Japanese Patent Application Laid-open No. 5-114860 discloses a technique of a sensor A/D conversion device including an A/D conversion unit receiving predetermined constant quantity of electricity and performing A/D conversion on the constant quantity of electricity separately from A/D conversion on quantity of electricity output from a sensor, and a determination unit determining that the A/D conversion unit is abnormal when a conversion value by the A/D conversion unit exceeds a constant range from a conversion value of the above-mentioned constant quantity of electricity.

There is still room for improvement in the technique of determining the abnormality of the A/D converter. For example, the A/D converter includes a selector that switches input to an A/D conversion circuit among a plurality of inputs in some cases. In this case, not only abnormality of the A/D conversion circuit but also abnormality such as fixation of the selector possibly occurs. Reliability of the A/D converter and a power supply device including the A/D converter can be improved when the abnormality of the A/D converter including the selector can be determined.

SUMMARY OF THE INVENTION

An object of the present invention is to provide a power supply device and an abnormality determination method for an A/D converter that can improve reliability of the A/D converter.

In order to achieve the above mentioned object, a power supply device according to one aspect of the present invention includes a voltage adjusting unit configured to adjust a voltage from a power source in accordance with a power supply instruction and supply the adjusted voltage to a load; an A/D converter; a determination unit configured to determine abnormality of the A/D converter; and a supply unit configured to supply a voltage for abnormality determination, wherein the A/D converter includes an A/D conversion circuit that converts a voltage to a digital value, a plurality of input ports, and a selector that connects any one of the input ports to the A/D conversion circuit, the input ports include a load port that receives a supply voltage to the load, a first diagnostic port, and a second diagnostic port, the supply unit supplies a first voltage value to the first diagnostic port and supplies a second voltage value that is different from the first voltage value to the second diagnostic port, and the determination unit determines the abnormality of the A/D converter on the basis of a conversion result by the A/D conversion circuit when the selector is controlled to connect the first diagnostic port and the A/D conversion circuit together and a conversion result by the A/D conversion circuit when the selector is controlled to connect the second diagnostic port and the A/D conversion circuit together.

According to another aspect of the present invention, in the power supply device, it is preferable that the power supply device further includes a voltage dividing circuit that is interposed between the supply unit and both the first diagnostic port and the second diagnostic port, wherein the supply unit outputs a voltage having a pulse waveform, and the voltage having the pulse waveform that the supply unit outputs is output to the first diagnostic port from the voltage dividing circuit in a form of pulse waveform in which the first voltage value and a LO voltage are alternately repeated, and is output to the second diagnostic port from the voltage dividing circuit in a form of pulse waveform in which the second voltage value and the LO voltage are alternately repeated.

According to still another aspect of the present invention, an abnormality determination method for an A/D converter includes a step of determining abnormality of the A/D converter including a plurality of input ports that includes a first diagnostic port and a second diagnostic port, an A/D conversion circuit, and a selector that connects any one of the input ports to the A/D conversion circuit, wherein the step includes: a first acquiring step of acquiring a conversion result by the A/D conversion circuit when the selector is controlled to connect the first diagnostic port and the A/D conversion circuit and a first voltage value is supplied to the first diagnostic port; a second acquiring step of acquiring a conversion result by the A/D conversion circuit when the selector is controlled to connect the second diagnostic port and the A/D conversion circuit and a second voltage value that is different from the first voltage value is supplied to the second diagnostic port; and a determining step of determining the abnormality of the A/D converter on the basis of information acquired at the first acquiring step and information acquired at the second acquiring step.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Hereinafter, a power supply device and an abnormality determination method for an A/D converter according to an embodiment of the present invention will be described in detail with reference to the drawings. It should be noted that the embodiment does not limit this invention. Components in the following embodiment include components that those skilled in the art can easily suppose or substantially the same components.

Embodiment

Figure 1:
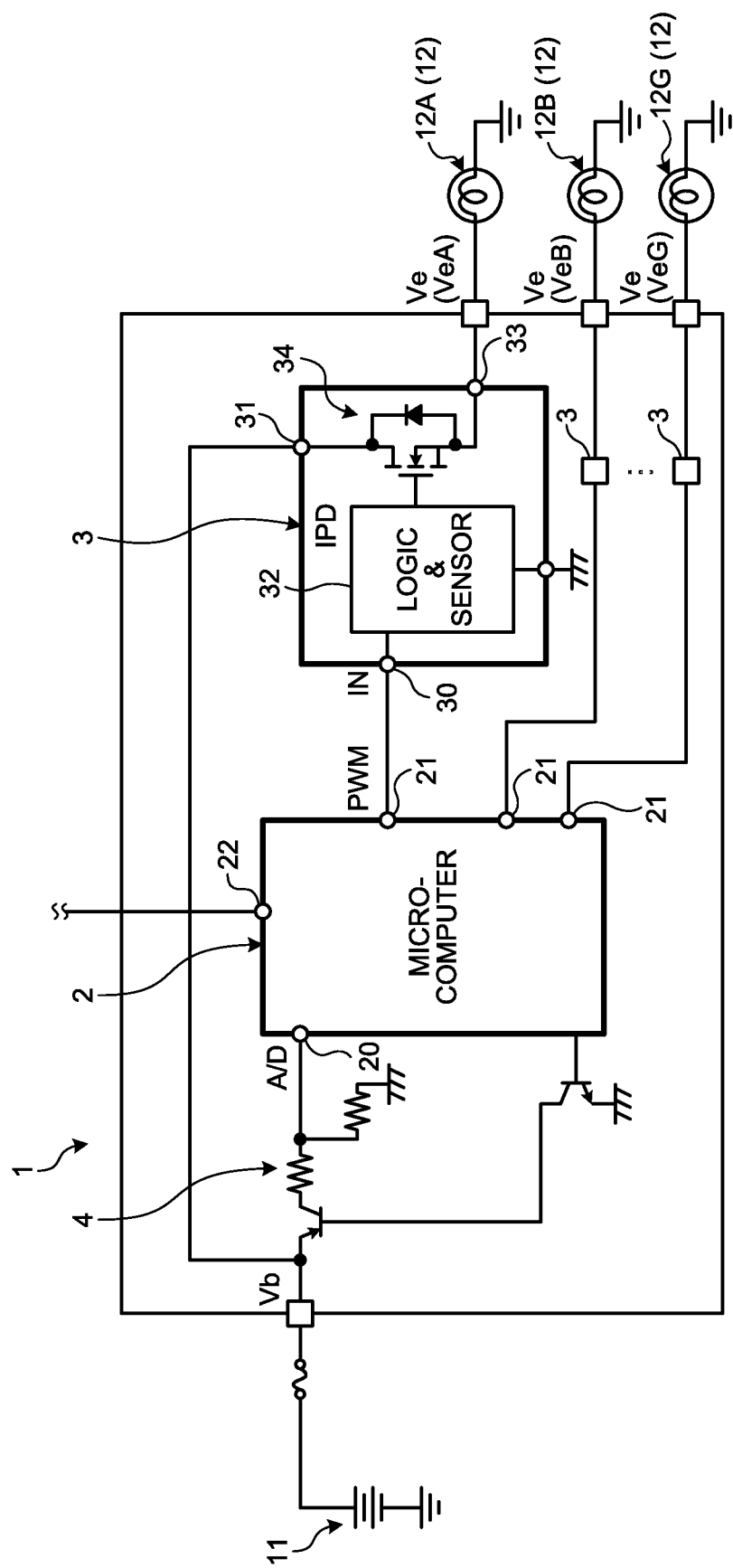
FIG. 1 is a diagram illustrating a power supply device according to an embodiment.
Figure 2:
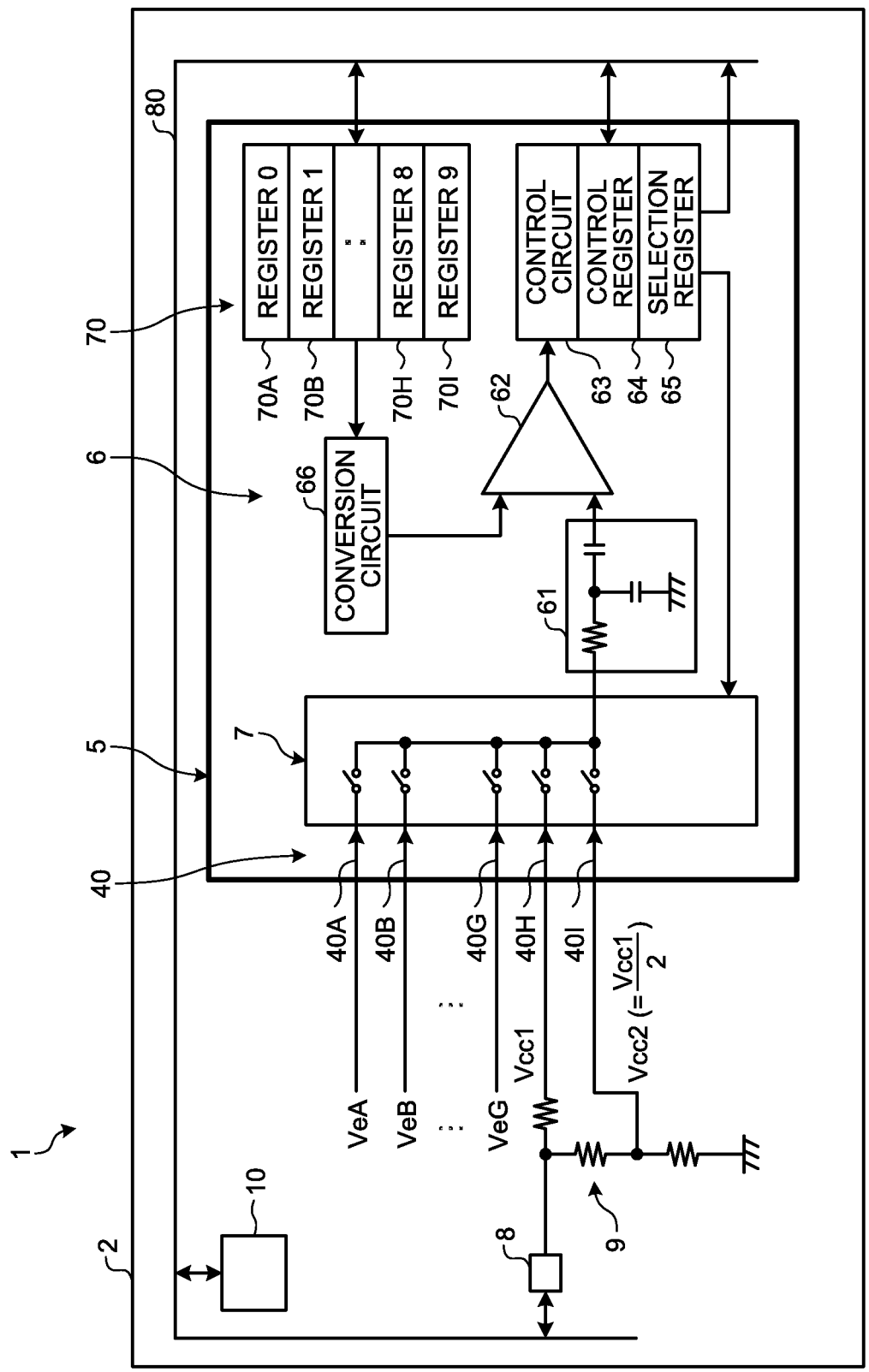
FIG. 2 is a diagram illustrating a controller in the embodiment.
Figures 3, 4:
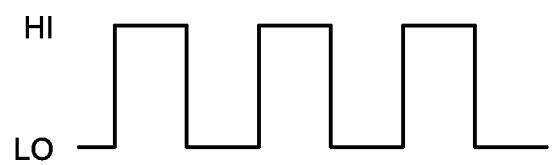
FIG. 3 is a chart illustrating an output waveform by a supply unit in the embodiment.
FIG. 4 is a descriptive diagram for explaining an abnormality determination method related to a first diagnostic port.
Figures 5, 6:
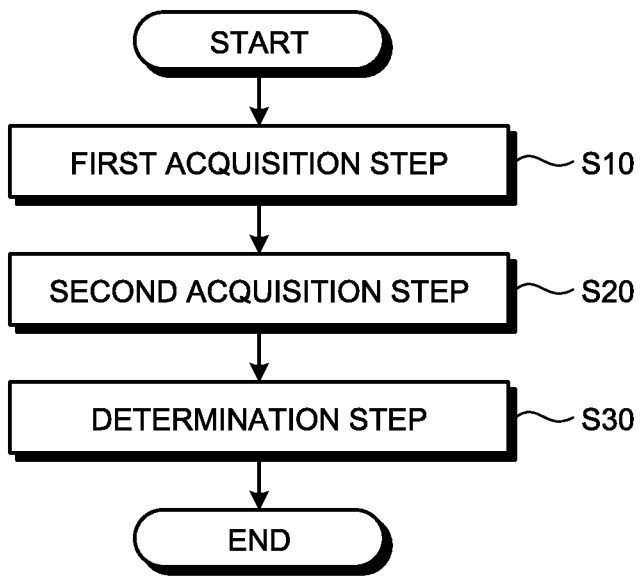
FIG. 5 is a descriptive diagram for explaining an abnormality determination method related to a second diagnostic port.
FIG. 6 is a flowchart illustrating an abnormality determination method for an A/D converter in the embodiment.

An embodiment will be described with reference to FIG. 1 to FIG. 6. The embodiment relates to a power supply device and an abnormality determination method for an A/D converter. FIG. 1 is a diagram illustrating the power supply device in the embodiment, FIG. 2 is a diagram illustrating a controller in the embodiment, FIG. 3 is a chart illustrating an output waveform by a supply unit in the embodiment, FIG. 4 is a descriptive diagram for explaining an abnormality determination method related to a first diagnostic port, FIG. 5 is a descriptive diagram for explaining an abnormality determination method related to a second diagnostic port, and FIG. 6 is a flowchart illustrating the abnormality determination method for the A/D converter in the embodiment.

A power supply device 1 in the embodiment, which is illustrated in FIG. 1, is mounted on a vehicle and supplies electric power to electric loads (hereinafter, simply referred to as "loads") 12 of the vehicle. The loads 12 to which the power supply device 1 supplies the power are, for example, lamps such as a headlamp of the vehicle. The power supply device 1 controls supply voltages Ve to the loads 12 with switching elements 34 including semiconductors and is configured as a semiconductor relay module that blocks power supply to the loads 12 using software. A controller 2 of the power supply device 1 estimates heat generation amounts of electrical wires on the basis of current values that are supplied to the respective loads 12 and stops power supply to the loads 12 on the basis of estimation results. Hereinafter, the power supply device 1 in the embodiment will be described in detail.

The power supply device 1 is electrically connected to a power source 11 of the vehicle. The power source 11 is, for example, a secondary battery such as a battery. The power supply device 1 includes the controller 2 and voltage adjusting units 3. An input portion 20 of the controller 2 is connected to the power source 11 with a voltage dividing circuit 4 interposed therebetween. An input voltage Vb from the power source 11 is divided and input to the input portion 20. The controller 2 calculates the input voltage Vb on the basis of the voltage input to the input portion 20. The controller 2 has signal output ports 21. The signal output ports 21 are respectively connected to signal input ports 30 of the voltage adjusting units 3.

Each voltage adjusting unit 3 adjusts the input voltage Vb from the power source 11 in accordance with a power supply instruction and supplies it to the load 12. The voltage adjusting unit 3 has an input portion 31, an output portion 33, a control circuit 32, and the switching element 34 in addition to the signal input port 30. The input portion 31 is electrically connected to the power source 11. The output portion 33 is electrically connected to the load 12. The control circuit 32 includes a protection circuit. A circuit in the control circuit 32 is configured so as to execute operations that are described in the embodiment or the control circuit 32 executes the operations on the basis of previously stored programs. The switching element 34 is interposed between the input portion 31 and the output portion 33. The switching element 34 connects or disconnects the input portion 31 and the output portion 33 in accordance with a control signal input through the input portion 31. The switching element 34 in the embodiment is a metal oxide semiconductor field effect transistor (MOSFET).

The controller 2 outputs the control signals for controlling the switching elements 34 through the signal output ports 21. The control signals are, for example, pulse signals. The controller 2 controls the switching elements 34 to provide duty control. The duty control performed by the controller 2 in the embodiment is PWM control. The controller 2 determines duty ratios on the basis of target values of the supply voltages Ve to the loads 12 and the calculated input voltage Vb. The controller 2 generates the control signals on the basis of the determined duty ratios and outputs them through the signal output ports 21. The output control signals are transmitted to the switching elements 34 through the signal input ports 30 and the control circuits 32. Each switching element 34 connects the input portion 31 and the output portion 33 together in accordance with an ON instruction of the control signal and supplies power to the load 12. Each switching element 34 disconnects the input portion 31 and the output portion 33 from each other in accordance with an OFF instruction of the control signal and stops power supply to the load 12. The controller 2 adjusts the duty ratios such that effective values of the supply voltages Ve to the loads 12 are target values with ON/OFF control of the switching elements 34.

The controller 2 has an instruction input port 22 through which the power supply instruction is input. For example, when a user performs an operation such as a switch operation of activating the load 12, a signal of the power supply instruction is input through the instruction input port 22. The controller 2 controls the voltage adjusting unit 3 and supplies power to the load 12 when receiving the signal of the power supply instruction. On the other hand, the controller 2 stops power supply to the load 12 when receiving no signal of the power supply instruction.

The power supply device 1 in the embodiment supplies power to the loads 12 (12A, 12B, ..., and 12G). The power supply device 1 includes the voltage adjusting units 3 corresponding to the respective loads 12. The controller 2 controls the supply voltages Ve (VeA, VeB, ..., and VeG) to the respective loads 12 (12A, 12B, ..., and 12G) through the respective voltage adjusting units 3.

As illustrated in FIG. 2, the controller 2 has an A/D converter 5, a determination unit 10, and a supply unit 8. The A/D converter 5 has an A/D conversion circuit 6, a plurality of input ports 40, and a selector 7. The A/D conversion circuit 6 converts an analog voltage to a digital value (digital signal). The A/D conversion circuit 6 has a sample hold circuit 61, a comparison circuit 62, a control circuit 63, a control register 64, a selection register 65, a conversion circuit 66, and registers 70.

The sample hold circuit 61 is connected to any of the input ports 40 with the selector interposed therebetween. The input ports 40 include load ports 40A, 40B, ..., and 40G, a first diagnostic port 40H, and a second diagnostic port 40I. The supply voltages Ve (VeA, VeB, ..., and VeG) to the respective loads 12 (12A, 12B, ..., and 12G) are input to the respective load ports 40A, 40B, ..., and 40G. For example, the supply voltage VeA to the first load 12A among the loads 12 is input to the first load port 40A.

The supply unit 8 supplies voltages to the first diagnostic port 40H and the second diagnostic port 40I. The first diagnostic port 40H and the second diagnostic port 40I are connected together to the supply unit 8 with a voltage dividing circuit 9 interposed therebetween. A reference voltage (hereinafter, referred to as a "first voltage value") Vcc1 [V] is input to the first diagnostic port 40H. A voltage (hereinafter, referred to as a "second voltage value") Vcc2 [V] that is the half of the first voltage value Vcc1 is input to the second diagnostic port 40I. The first voltage value Vcc1 and the second voltage value Vcc2 are predetermined voltage values for malfunction diagnosis. The first voltage value Vcc1 is, for example, 5 [V].

The selector 7 connects any one of the input ports 40 to the sample hold circuit 61. For example, when the selector 7 electrically connects the first load port 40A and the sample hold circuit 61 together, the other load ports 40B, . . . , and 40G, the first diagnostic port 40H, and the second diagnostic port 40I are disconnected from the sample hold circuit 61.

The sample hold circuit 61 is a circuit that can hold a voltage of the connected input port 40. The sample hold circuit 61 samples and holds the voltage of the input port 40 in accordance with a holding instruction from the control circuit 63. The comparison circuit 62 outputs, to the control circuit 63, a comparison result between the voltage value held by the sample hold circuit 61 and a voltage value input from the conversion circuit 66. The control circuit 63 controls the control register 64, the selection register 65, and the registers 70. The registers 70 include a plurality of registers 70A, 70B, . . . , 70H and 70I storing therein digital values corresponding to voltage values of the respective input ports 40. To be more specific, the registers 70 include the load registers 70A, 70B, and the like corresponding to the load ports 40A, 40B, and the like. For example, the first load register 70A stores therein a result of A/D conversion of the supply voltage VeA of the first load port 40A. The first diagnostic register 70H of the registers 70 stores therein a digital value corresponding to the first voltage value Vcc1 of the first diagnostic port 40H. The second diagnostic register 70I stores therein a digital value corresponding to the second voltage value Vcc2 of the second diagnostic port 40I.

The control circuit 63 connects the input port 40 the supply voltage of which is to be converted to the A/D conversion circuit 6 with the selector 7, and stores a digital value as a conversion result in the register 70 corresponding to the input port 40. When the input port 40 the supply voltage of which is to be converted is, for example, the first load port 40A, the control circuit 63 connects the first load port 40A to the A/D conversion circuit 6 with the selector 7. The control circuit 63 switches a value (port number) of the selection register 65 to a value corresponding to the first load port 40A. The selector 7 connects the first load port 40A to the sample hold circuit 61 in accordance with the value of the selection register 65.

The control circuit 63 transfers a value of the control register 64 to the first load register 70A corresponding to the first load port 40A. The conversion circuit 66 converts a digital value in the first load register 70A to an analog voltage and outputs it to the comparison circuit 62. The control circuit 63 increments or decrements the value in the control register 64 and the first load register 70A on the basis of output from the comparison circuit 62. The control circuit 63 finishes A/D conversion when the value in the first load register 70A becomes a value corresponding to the supply voltage VeA of the first load port 40A. In this manner, the analog voltage of the input port 40 is converted to the digital value and is stored in the register 70.

The control circuit 63 sequentially converts the voltage values of the input ports 40 and stores them in the registers 70. For example, the control circuit 63 converts the voltage values of the load ports 40A, 40B, . . . , and 40G in this order and further converts the voltage values of the first diagnostic port 40H and the second diagnostic port 40I. When conversion of the voltage values of all of the input ports 40 is completed, the control circuit 63 repeats the conversion of the voltage values in the order from the first load port 40A again.

The control circuit 63, the control register 64, the selection register 65, the registers 70, the supply unit 8, and the determination unit 10 are connected together so as to be communicable with one another via an internal bus 80. As will be described later, the determination unit 10 determines abnormality of the A/D converter 5 on the basis of conversion results by the A/D conversion circuit 6 when the selector 7 is controlled to connect the first diagnostic port 40H and the A/D conversion circuit 6 and conversion results by the A/D conversion circuit 6 when the selector 7 is controlled to connect the second diagnostic port 40I and the A/D conversion circuit 6.

The supply unit 8 outputs a pulse voltage as illustrated in FIG. 3. In the embodiment, LO is 0 [V] and HI is, for example, 5 [V]. When the supply unit 8 outputs a voltage of HI, the first voltage value Vcc1 is input to the first diagnostic port 40H and the second voltage value Vcc2 is input to the second diagnostic port 40I.

The determination unit 10 is, for example, a computer including an operation unit, a storage unit, and an input/output unit. A circuit in the determination unit 10 is configured so as to execute operations that are described in the embodiment or the determination unit 10 executes the operations on the basis of previously stored programs. The determination unit 10 in the embodiment determines the abnormality of the A/D converter 5 as is described with reference to FIG. 4 to FIG. 6 below. The abnormality determination method for the A/D converter in the embodiment includes a plurality of steps as illustrated in the flowchart in FIG. 6. The steps include a first acquisition step (step S10), a second acquisition step (step S20), and a determination step (step S30).

At step S10, the determination unit 10 executes the first acquisition step. The first acquisition step is a step of acquiring the conversion results by the A/D conversion circuit 6 when the selector 7 is controlled to connect the first diagnostic port 40H and the A/D conversion circuit 6. The control circuit 63 controls the selector 7 through the selection register 65. The determination unit 10, for example, determines a period in which the first acquisition step is to be executed with reference to the value of the selection register 65. When the value of the selection register 65 is the port number of the first diagnostic port 40H, the determination unit 10 can determine that an instruction to connect the first diagnostic port 40H and the A/D conversion circuit 6 together is issued to the selector 7. The determination unit 10 executes the first acquisition step in a period in which the instruction to connect the first diagnostic port 40H and the A/D conversion circuit 6 together is issued to the selector 7.

At the first acquisition step, the determination unit 10 acquires voltage values (HI/LO) of output voltages that the supply unit 8 outputs and conversion results by the A/D conversion circuit 6 that correspond to the output voltages. The conversion results by the A/D conversion circuit 6 are acquired from the first diagnostic register 70H. To be more specific, the determination unit 10 acquires a value in the first diagnostic register 70H when the output voltage from the supply unit 8 is HI and a value in the first diagnostic register 70H when the output voltage from the supply unit 8 is LO. When step S10 has been executed, the process advances to step S20.

At step S20, the determination unit 10 executes the second acquisition step. The second acquisition step is a step of acquiring the conversion results by the A/D conversion circuit 6 when the selector 7 is controlled to connect the second diagnostic port 40I and the A/D conversion circuit 6 together. The determination unit 10 determines a period in which an instruction to connect the second diagnostic port 40I and the A/D conversion circuit 6 together is issued to the selector 7 on the basis of the value of the selection register 65. The determination unit 10 executes the second acquisition step in this period.

At the second acquisition step, the determination unit 10 acquires voltage values (HI/LO) of the output voltages that the supply unit 8 outputs and conversion results by the A/D conversion circuit 6 that correspond to the output voltages. The conversion results by the A/D conversion circuit 6 are acquired from the second diagnostic register 70I. To be more specific, the determination unit 10 acquires a value in the second diagnostic register 70I when the output voltage from the supply unit 8 is HI and a value in the second diagnostic register 70I when the output voltage from the supply unit 8 is LO. When step S20 has been executed, the process advances to step S30.

At step S30, the determination unit 10 executes the determination step. The determination step is a step of determining the abnormality of the A/D converter 5 on the basis of information acquired at the first acquisition step and information acquired at the second acquisition step. The determination unit 10 determines the abnormality of the A/D converter 5, for example, as is described with reference to FIG. 4 to FIG. 5 below.

The determination unit 10 determines the abnormality of the A/D converter 5 on the basis of results of the conversion of the voltage values of the first diagnostic port 40H as indicated in Table illustrated in FIG. 4. In the case in which the output from the supply unit 8 is HI, the determination unit 10 determines that the A/D converter 5 is normal when the value in the first diagnostic register 70H is the first voltage value Vcc1. On the other hand, in the case in which the output from the supply unit 8 is HI, the determination unit 10 determines that the A/D converter 5 is abnormal when the value in the first diagnostic register 70H is different from the first voltage value Vcc1. The determination unit 10 determines that the value in the first diagnostic register 70H is different from the first voltage value Vcc1 when a difference between the value in the first diagnostic register 70H and the first voltage value Vcc1 is equal to or larger than a predetermined value.

In the case in which the output from the supply unit 8 is LO, the determination unit 10 determines that the A/D converter 5 is normal when the value in the first diagnostic register 70H is LO whereas the determination unit 10 determines that the A/D converter 5 is abnormal when the value in the first diagnostic register 70H is different from LO.

The determination unit 10 further determines the abnormality of the A/D converter 5 on the basis of results of the conversion of the voltage values of the second diagnostic port 40I as indicated in Table illustrated in FIG. 5. In the case in which the output from the supply unit 8 is HI, the determination unit 10 determines that the A/D converter 5 is normal when the value in the second diagnostic register 70I is the second voltage value Vcc2. On the other hand, in the case in which the output from the supply unit 8 is HI, the determination unit 10 determines that the A/D converter 5 is abnormal when the value in the second diagnostic register 70I is different from the first voltage value Vcc2.

In the case in which the output from the supply unit 8 is LO, the determination unit 10 determines that the A/D converter 5 is normal when the value in the second diagnostic register 70I is LO whereas the determination unit 10 determines that the A/D converter 5 is abnormal when the value in the second diagnostic register 70I is different from LO.

The determination unit 10 in the embodiment can determine the abnormality of the A/D converter 5 in not only the case in which abnormality occurs in the A/D conversion circuit 6 but also the case in which abnormality occurs in the selector 7. For example, it is assumed that the selector 7 is undesirably fixed to any of the load ports 40A, 40B, ..., and 40G. In this case, as is described below, the determination unit 10 can determine the abnormality of the A/D converter 5 on the basis of conversion results of the first voltage value Vcc1 and the second voltage value Vcc2 input voltages of which are different from each other.

As will be described more in detail, when fixation of the selector 7 occurs, supply of the supply voltage Ve of the input port 40 to which the selector 7 is fixed is kept with respect to the A/D conversion circuit 6. Accordingly, the value in the first diagnostic register 70H that has been acquired for the output voltage of HI at S10 and the value in the second diagnostic register 70I that has been acquired for the output voltage of HI at step S20 are the same values or substantially the same values. In this case the conversion result at any of step S10 and step S20 in the case in which the output voltage is HI is determined to be abnormal. As a result, it can be determined that the A/D converter 5 is not normally operated.

As described above, with the power supply device 1 and the abnormality determination method for the A/D converter in the embodiment, abnormality is detected from the conversion results in not only the case in which the A/D conversion circuit 6 is abnormal but also the case in which the selector 7 is abnormal. As a comparative example for the embodiment, the case is supposed in which the second diagnostic port 40I is not provided, only one first diagnostic port 40H is provided as the port for diagnosis, and a voltage of one waveform is input for diagnosis. In this case, abnormality determination cannot be made even when abnormality such as the fixation occurs in the selector 7 in some cases. For example, it is assumed that the selector 7 is fixed to the first load port 40A. When the supply voltage VeA that is input to the first load port 40A has a voltage value equivalent to the first voltage value Vcc1, the A/D converter 5 can be mistakenly determined to be normal.

By contrast, in the power supply device 1 in the embodiment, the voltages of the two different waveforms are input for diagnosis of the abnormality of the A/D converter 5. The two waveforms are typically pulse waveforms. A first pulse waveform of the voltage that is input to the first diagnostic port 40H is a waveform of the first voltage value Vcc1 in the case in which the output voltage from the supply unit 8 is HI. A second pulse waveform of the voltage that is input to the second diagnostic port 40I is a waveform of the second voltage value Vcc2 in the case in which the output voltage from the supply unit 8 is HI. The first voltage value Vcc1 and the second voltage value Vcc2 are preferably different so as to be clearly distinguished from each other, and for example, the first voltage value Vcc1 is twice the second voltage value Vcc2.

The determination unit 10 determines the abnormality on the basis of the conversion results by the A/D conversion circuit 6 when the voltage having the first pulse waveform is input and the conversion results by the A/D conversion circuit 6 when the voltage having the second pulse waveform is input. Accordingly, the determination unit 10 determines that the A/D converter 5 is abnormal in not only the case in which abnormality occurs in the A/D conversion circuit 6 but also the case in which abnormality occurs in the selector 7, thereby improving reliability of the A/D converter 5.

As described above, the power supply device 1 in the embodiment includes the voltage adjusting units 3, the A/D converter 5, the determination unit 10, and the supply unit 8. The voltage adjusting units 3 adjust the voltage from the power source 11 in accordance with the power supply instruction and supply the adjusted voltages to the loads 12. The determination unit 10 determines the abnormality of the A/D converter 5. The supply unit 8 supplies the voltage for abnormality determination. The A/D converter 5 has the A/D conversion circuit 6, the input ports 40, and the selector 7. The A/D conversion circuit 6 converts a voltage to a digital value. The selector 7 connects any of the input ports 40 to the A/D conversion circuit 6.

The input ports 40 include the load ports 40A, 40B, ..., and 40G that receive the supply voltages Ve to the loads 12, the first diagnostic port 40H, and the second diagnostic port 40I. The supply unit 8 supplies the first voltage value Vcc1 to the first diagnostic port 40H and supplies the second voltage value Vcc2 to the second diagnostic port 40I. The first voltage value Vcc1 and the second voltage value Vcc2 are different voltage values.

The determination unit 10 determines the abnormality of the A/D converter 5 on the basis of the conversion results by the A/D conversion circuit 6 when the selector 7 is controlled to connect the first diagnostic port 40H and the A/D conversion circuit 6 and the conversion results by the A/D conversion circuit 6 when the selector 7 is controlled to connect the second diagnostic port 40I and the A/D conversion circuit 6.

The power supply device 1 in the embodiment determines the abnormality of the A/D converter 5 on the basis of the conversion results of the two different voltage values Vcc1 and Vcc2. The power supply device 1 in the embodiment can therefore determine that the A/D converter 5 is abnormal in the case in which the abnormality occurs in the selector 7, thereby improving reliability of the A/D converter 5.

The power supply device 1 in the embodiment further includes the voltage dividing circuit 9 interposed between the supply unit 8 and both the first diagnostic port 40H and the second diagnostic port 40I. The supply unit 8 outputs the voltage having the pulse waveform as illustrated in FIG. 3 (rectangular wave). The voltage having the pulse waveform that the supply unit 8 outputs is output to the first diagnostic port 40H from the voltage dividing circuit 9 in the form of pulse waveform in which the first voltage value Vcc1 and the LO voltage are alternately repeated. The pulse waveform of the voltage that is output to the first diagnostic port 40H is similar to the pulse waveform illustrated in FIG. 3 and the voltage corresponding to the HI voltage in FIG. 3 is the first voltage value Vcc1.

Furthermore, the voltage having the pulse waveform that the supply unit 8 outputs is output to the second diagnostic port 40I from the voltage dividing circuit 9 in the form of pulse waveform in which the second voltage value Vcc2 and the LO voltage are alternately repeated. The pulse waveform of the voltage that is output to the second diagnostic port 40I is similar to the pulse waveform illustrated in FIG. 3 and the voltage corresponding to the HI voltage in FIG. 3 is the second voltage value Vcc2. The voltages for abnormality determination have the pulse waveforms, and the abnormality of the A/D converter 5 can therefore be appropriately determined.

The abnormality determination method for the A/D converter in the embodiment includes a step of determining the abnormality of the A/D converter 5 having the input ports 40 that include the first diagnostic port 40H and the second diagnostic port 40I, the A/D conversion circuit 6, and the selector 7. The above-mentioned step includes the first acquisition step, the second acquisition step, and the determination step.

The first acquisition step is a step of acquiring the conversion results by the A/D conversion circuit 6 when the selector 7 is controlled to connect the first diagnostic port 40H and the A/D conversion circuit 6 and the first voltage value Vcc1 is supplied to the first diagnostic port 40H. The second acquisition step is a step of acquiring the conversion results by the A/D conversion circuit 6 when the selector 7 is controlled to connect the second diagnostic port 40I and the A/D conversion circuit 6 and the second voltage value Vcc2 is supplied to the second diagnostic port 40I. The determination step is a step of determining the abnormality of the A/D converter 5 on the basis of information acquired at the first acquisition step and information acquired at the second acquisition step.

With the abnormality determination method for the A/D converter in the embodiment, the abnormality of the A/D converter 5 is determined on the basis of the conversion results of the two different voltage values Vcc1 and Vcc2. The abnormality determination method for the A/D converter in the embodiment can therefore determine that the A/D converter 5 is abnormal in the case in which the abnormality occurs in the selector 7, thereby improving reliability of the A/D converter 5.

With the abnormality determination method for the A/D converter in the embodiment, the voltage of the above-mentioned first pulse waveform may be input to the first diagnostic port 40H at the first acquisition step and the voltage of the above-mentioned second pulse waveform may be input to the second diagnostic port 40I at the second acquisition step.

Modifications of Embodiment

Modifications of the embodiment will be described. The determination unit 10 may be a circuit/device independent of another circuit/device in the controller 2 or may be included in another circuit/device. For example, the control circuit 63 of the controller 2 may have the function of the determination unit 10.

The second voltage value Vcc2 is not limited to the value that is the half of the first voltage value Vcc1. A ratio between the first voltage value Vcc1 and the second voltage value Vcc2 is appropriately determined such that the abnormality of the A/D converter 5 can be determined in at least the case in which abnormality occurs in the selector 7. The second voltage value Vcc2 is set to an appropriate voltage value between the LO voltage and the first voltage value Vcc1.

The loads 12 are not limited to the lamps. The loads 12 may be other loads requiring the stable supply voltages Ve.

Furthermore, the loads 12 may be still other loads requiring successive supply of power in a state in which an operation request is made (for example, state in which the user switches ON).

The specific configuration of the A/D conversion circuit 6 is not limited to the exemplified configuration. The A/D conversion circuit 6 may have another circuit configuration capable of converting a value of an analog voltage to a digital value.

The determination unit 10 may repeatedly perform provisional determination of normality/abnormality based on the first voltage value Vcc1 and confirm the determination of the abnormality of the A/D converter 5 when the provisional determination of the abnormality lasts a plurality of number of times. The determination unit 10 may confirm the determination of the normality of the A/D converter 5 when the provisional determination of the normality based on the first voltage value Vcc1 lasts a plurality of number of times. The determination unit 10 may confirm the determination of the abnormality of the A/D converter 5 when a generation frequency of the provisional determination of the abnormality exceeds a predetermined value. The determination unit 10 may introduce provisional determination into normality/abnormality determination based on the second voltage value Vcc2 in the same manner as in the determination based on the first voltage value Vcc1.

Contents disclosed in the above-mentioned embodiment and modification can be appropriately combined for execution.

The power supply device according to the present embodiment includes the voltage adjusting units configured to adjust the voltage from the power source in accordance with the power supply instruction and supply the adjusted voltages to the loads, the A/D converter, the determination unit configured to determine the abnormality of the A/D converter, and the supply unit configured to supply voltages for abnormality determination. The A/D converter includes the A/D conversion circuit that converts a voltage to a digital value, the input ports, and the selector that connects any one of the input ports to the A/D conversion circuit. The input ports include the load ports that receive the supply voltages to the loads, the first diagnostic port, and the second diagnostic port.

The supply unit supplies the first voltage value to the first diagnostic port and supplies the second voltage value that is different from the first voltage value to the second diagnostic port. The determination unit determines the abnormality of the A/D converter on the basis of the conversion results by the A/D conversion circuit when the selector is controlled to connect the first diagnostic port and the A/D conversion circuit together and the conversion results by the A/D conversion circuit when the selector is controlled to connect the second diagnostic port and the A/D conversion circuit together. The power supply device according to the present embodiment determines the abnormality of the A/D converter on the basis of the conversion results of the two different voltage values, thereby providing the effect that reliability of the A/D converter can be improved.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A power supply device comprising:
   a voltage adjusting unit configured to adjust a first voltage from a power source in accordance with a power supply instruction and supply the adjusted first voltage to a load;
   an A/D converter;
   a determination unit configured to determine abnormality of the A/D converter; and
   a supply unit configured to supply a plurality of second voltages for abnormality determination, wherein
   the A/D converter includes an A/D conversion circuit that converts at least one of the plurality of second voltages to a digital value, a plurality of input ports, and a selector that connects any one of the input ports to the A/D conversion circuit,
   the input ports include a load port that receives a supply voltage to the load, a first diagnostic port, and a second diagnostic port,
   the supply unit supplies a first pulse waveform in which a first voltage value and a LO voltage are alternately repeated to the first diagnostic port and supplies a second pulse waveform in which a second voltage value that is different from the first voltage value and the LO voltage are alternately repeated to the second diagnostic port,
   the determination unit acquires
      a first output value that is a conversion result by the A/D conversion circuit corresponding to the first voltage value when the selector is controlled to connect the first diagnostic port and the A/D conversion circuit together,
      a second output value that is a conversion result by the A/D conversion circuit corresponding to the LO voltage when the selector is controlled to connect the first diagnostic port and the A/D conversion circuit together,
      a third output value that is a conversion result by the A/D conversion circuit corresponding to the second voltage value when the selector is controlled to connect the second diagnostic port and the A/D conversion circuit together,
      a fourth output value that is a conversion result by the A/D conversion circuit corresponding to the LO voltage when the selector is controlled to connect the second diagnostic port and the A/D conversion circuit together, and
   the determination unit determines the abnormality of the A/D conversion circuit and the selector when at least one value of the first output value, the second output value, the third output value, and the fourth output value is abnormal.

2. The power supply device according to claim 1, further comprising:
   a voltage dividing circuit that is interposed, between the supply unit and both the first diagnostic port and the second diagnostic port, wherein
   the supply unit outputs the same voltage signal having a pulse waveform, and
   the same voltage signal having the pulse waveform that the supply unit outputs is output to the first diagnostic port from the voltage dividing circuit as the first pulse waveform, and is output to the second diagnostic port from the voltage dividing circuit as the second pulse waveform.

3. An abnormality determination method for an A/D converter, the abnormality determination method comprising:

a step of determining abnormality of the A/D converter including a plurality of input ports that includes a first diagnostic port and a second diagnostic port, an A/D conversion circuit, and a selector that connects any one of the input ports to the A/D conversion circuit, wherein the step includes:

- a first acquiring step of acquiring a first conversion result by the A/D conversion circuit when the selector is controlled to connect the first diagnostic port and the A/D conversion circuit and a first pulse waveform in which a first voltage value and a LO voltage are alternately repeated is supplied to the first diagnostic port;
- a second acquiring step of acquiring a second conversion result by the A/D conversion circuit when the selector is controlled to connect the second diagnostic port and the A/D conversion circuit and a second pulse waveform in which second voltage value that is different from the first voltage and the LO voltage are alternately repeated is supplied to the second diagnostic port; and
- a determining step of determining the abnormality of the A/D conversion circuit and the selector on the basis of information acquired at the first acquiring step and information acquired at the second acquiring step, wherein in the first acquiring step a first output value that is a conversion result by the A/D conversion circuit corresponding to the first voltage value and a second output value that is a conversion result by the A/D conversion circuit corresponding to the LO voltage are acquired, in the second acquiring step a third output value that is a conversion result by the A/D conversion circuit corresponding to the second voltage value and a fourth output value that is a conversion result by the A/D conversion circuit corresponding to the LO voltage are acquired, and in the determining step the abnormality of the A/D conversion circuit and the selector is determined when at least one value of the first output value, the second output value, the third output value, and the fourth output value is abnormal.

4. The power supply device according to claim 1, wherein the second voltage value is a ratio of the first voltage value.

5. The power supply device according to claim 1, wherein the second voltage value is half of the first voltage value.

* * * * *